United States Patent [19]

Hibino

[11] Patent Number: 4,973,935

[45] Date of Patent: Nov. 27, 1990

[54] INFRARED DETECTOR

[75] Inventor: Masahiro Hibino, Itami, Japan

[73] Assignee: Mitsubishi Denki Kabushiki Kaisha, Japan

[21] Appl. No.: 459,302

[22] Filed: Dec. 28, 1989

[30] Foreign Application Priority Data

Mar. 10, 1989 [JP] Japan ........ 1-58762

[51] Int. Cl.[5] ........ H01C 4/04

[52] U.S. Cl. ........ 338/25; 338/306; 338/15

[58] Field of Search ........ 338/25, 15, 22 R, 22 SD, 338/23, 24, 306; 374/185, 183, 205, 210

[56] References Cited

U.S. PATENT DOCUMENTS

| | | | |
|---|---|---|---|
| 2,258,958 | 10/1941 | Pearson | 338/25 |
| 4,222,025 | 9/1980 | Iles et al. | 338/25 |
| 4,400,684 | 8/1983 | Kushida et al. | 338/25 |
| 4,581,928 | 4/1986 | Johnson | 73/204 |
| 4,652,335 | 3/1987 | Decoster et al. | 156/643 |

FOREIGN PATENT DOCUMENTS

| | | |
|---|---|---|
| 0191697 | 8/1986 | European Pat. Off. . |
| 63-107074 | 5/1988 | Japan . |
| 2071414 | 9/1981 | United Kingdom . |

*Primary Examiner*—Bruce A. Reynolds
*Assistant Examiner*—M. M. Lateef
*Attorney, Agent, or Firm*—Leydig, Voit & Mayer

[57] ABSTRACT

An infrared detector includes a high resistance substrate, a compound semiconductor disposed on the substrate, a pair of electrodes disposed on the compound semiconductor, and a plurality of grooves in the compound semiconductor perpendicular to a current path between the electrodes, wherein the grooves have shallower than the thickness of the compound semiconductor.

6 Claims, 2 Drawing Sheets

INFRARED DETECTOR

FIELD OF THE INVENTION

The present invention relates to an infrared detector, having improved sensitivity.

BACKGROUND OF THE INVENTION

FIGS. 2(*a*) and 2(*b*) show a plan view and a cross sectional view, respectively, of a prior art photoconductivity type infrared detector.

In these figures, a compound semiconductor such as $Cd_xHg_{1-x}Te$ or InSb 2 is disposed on a high resistance substrate 1 comprising CdTe. A pair of electrodes 3*a* and 3*b* are disposed on the compound semiconductor 2 opposite each other. A light receiving section 4 is disposed at the surface of the compound semiconductor 2 between the electrodes 3*a* and 3*b*. Reference numeral 5 designates paths of bias currents.

The device will operate as follows.

In order to extend the wavelength sensitivity of the photoconductivity type infrared detector beyond that of infrared rays, $Cd_xHg_{1-x}Te$ or InSb having a narrow energy band gap is used as the compound semiconductor 2. When an infrared ray having larger energy than the energy band gap of that material is incident on the light receiving section 4, excess carriers are generated by the light that is absorbed by the compound semiconductor 2. The variation in the electrical conductivity due to these excess carriers is output as a signal in use, the detector is cooled down to about 77 K. by using liquid nitrogen to limit the dark current.

Furthermore, when the element resistance is r(Ω), the bias current $i_B$ is (A), and the voltage between the electrodes 3*a* and 3*b* is V (V), the voltage V becomes $$V = r \cdot i_B. \tag{1}$$

Since the bias current $i_B$ in the formula (1) is usually constant, the variation in the element resistance Δr due to the excess carriers is detected as a signal $V_s$ (V), that is, as a variation ΔV in the voltage from the following formula $$V_S = \Delta V = Vr \cdot i_B. \tag{2}$$

On the other hand, the element resistance r becomes $$r = k \cdot \frac{l}{nwt} \tag{3}$$

$$\left( = k \cdot \frac{1}{nt}, \text{ when } l = w \right).$$

Herein, l, w, and t represent the length, width, and thickness of the light receiving section 4, respectively. Furthermore, n ($cm^{-3}$) represent the carrier concentration of the compound semiconductor 2, and k represents a proportionality constant.

Usually the light receiving section 4 is a square shape, and then l=w. Furthermore, when the excess carriers generated in the compound semiconductor due to the incident energy $\Phi_S$ (W) are Δn ($cm^{-3}$), Δn is $$\Delta n = k' \cdot \Phi_S, \tag{4}$$

herein, k' is a proportional constant. The variation Δr in the element resistance r due to this Δn becomes as in the formula (5) from the formula (3)

$$r + \Delta r = k \cdot \frac{1}{(n + \Delta n)t}. \tag{5}$$

Accordingly, $$\Delta r = -\frac{k}{t} \cdot \frac{\Delta n}{n^2} = -r \cdot \frac{\Delta n}{n}. \tag{6}$$

Accordingly, from the formulae (2), (6) and (4), $$\begin{aligned} V_S &= -r \cdot \frac{\Delta n}{n} \cdot i_B \\ &= -\left( \frac{k' \cdot i_B}{n} \right) \cdot r \cdot \Phi_S, \end{aligned} \tag{7}$$

When the sensitivity of the element is R(V/W), then R is $$R = \left| \frac{V_s}{\Phi_s} \right| = \left( \frac{k' \cdot i_B}{n} \right) \cdot r. \tag{8}$$

From the above, it is found that the sensitivity R is inversely proportional to the carrier concentration n of the compound semiconductor 2 and is proportional to the element resistance r.

As described above, in the prior art infrared detector, in order to increase the sensitivity R, it is necessary to increase the resistance r to make the carrier concentration n quite small and to make the layer thickness t of the compound semiconductor 2 quite thin. The value of n has been lowered almost to the limit by advancing crystal growth techniques. However, the layer thickness t of the compound semiconductor layer 2 is required to be larger than some minimum value in order to effectively absorb the incident infrared rays. For example, in a case where infrared rays have wavelengths of 8 to 14 microns, it is required that the thickness t be larger than 15 to 20 microns, making it impossible to reduce the layer thickness t of the compound semiconductor 2. Thus, the layer thickness t is determined by conditions of such as the wavelength of the infrared rays to be absorbed and the element resistance is determined in accordance therewith, and the sensitivity is also restricted thereby.

SUMMARY OF THE INVENTION

It is an object of the present invention to provide an infrared detector with enhanced sensitivity without lowering the infrared absorption.

Other objects and advantages of the present invention will become apparent form the detailed description given hereinafter; it should be understood, however, that the detailed description and specific embodiment are given by way of illustration only, since various changes and modifications within the spirit and scope of the invention will become apparent to those skilled in the art from this detailed description.

According to an infrared detector of the present invention, a plurality of grooves having depths shallower than the thickness of the compound semiconductor are disposed in a portion of the compound semiconductor as a light receiving surface and in a direction perpendicular to the current path, between a pair of electrodes on the compound semiconductor. Therefore, the paths of the bias current are restricted to narrow regions by the grooves. Thus, the element resistance is increased and the element sensitivity is enhanced to a great extent. Furthermore, the film thickness of the compound semiconductor which is required to absorb the infrared ray is equal to that of the prior art device, and the absorption of the incident infrared is scarcely reduced.

DETAILED DESCRIPTION OF THE PREFERRED EMBODIMENTS

An embodiment of the present invention will be described in detail with reference to the drawings.

Figure 1A:
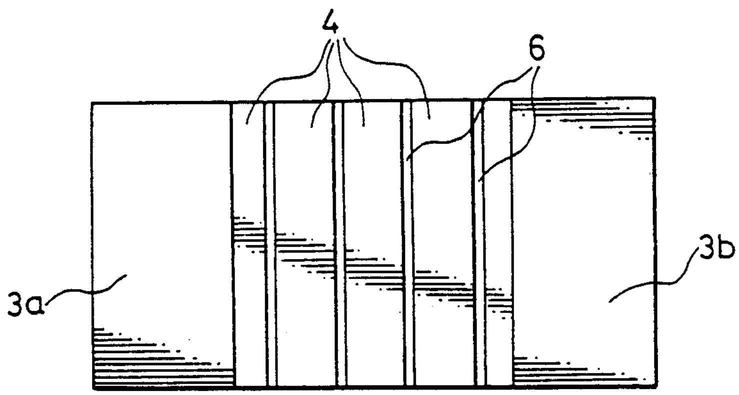
FIGS. 1(*a*) and 1(*b*) are a plan view and a cross sectional view, respectively, of an infrared detector according to an embodiment of the present invention.
Figure 1B:
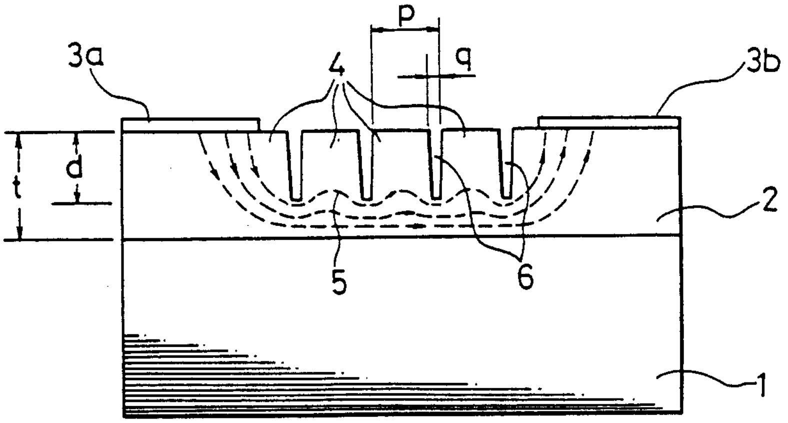
Figure 2A:
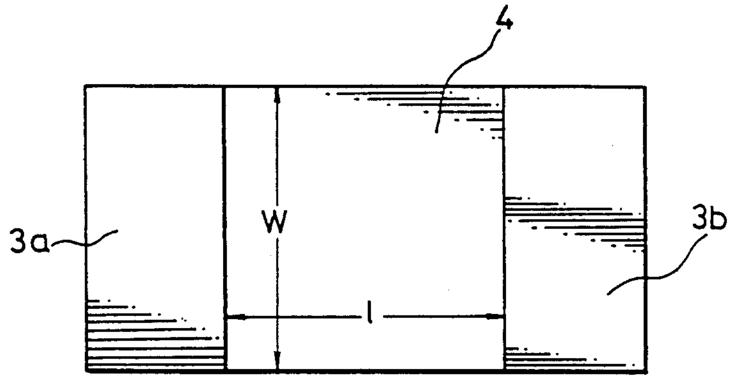
FIGS. 2(*a*) and 2(*b*) are a plan view and a cross sectional view, respectively, of a prior art infrared detector.
Figure 2B:
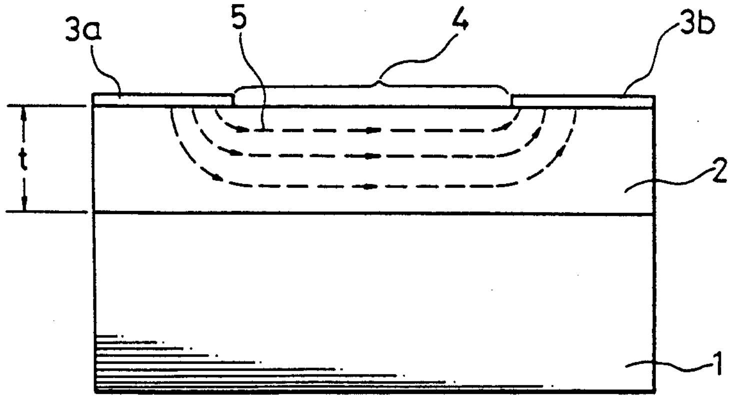

FIGS. 1(*a*) and 1(*b*) are a plan view and a cross sectional view, respectively, of an infrared detector according to an embodiment of the present invention. In these figures, the same reference numerals designate the same or corresponding elements as in FIGS 2(*a*) and 2(*b*). Reference numeral 6 designates a plurality of narrow grooves disposed in a light receiving region of the compound semiconductor 2, in a direction perpendicular to the current flowing in the compound semiconductor between the electrodes 3*a* and 3*b*. The width q of the groove 6 is smaller than the wavelength of the incident infrared light to prevent the loss of absorption of infrared light at the grooves 6. Furthermore, the pitch p of the grooves 6 is preferably almost equal to or less than the layer thickness t of the compound semiconductor 2. The depth d of the grooves 6 is shallower than the layer thickness t to facilitate the restriction of the path of the bias current 5. The grooves 6 can be easily produced by ion milling.

The device will operate as follows.

The operational principle is almost the same as that of the prior art device. In the present invention, as shown in FIG. 1, the path of the bias current 5 in the compound semiconductor substrate 2 is restricted to a narrow region by the grooves 6 having the depth d. That is, the layer thickness constituting a path for the bias current is about $(t-d)$ in the compound semiconductor layer of thickness t. The pitch p of the grooves 6 is required to be almost equal to or less than the layer thickness t. Furthermore, the width q of the groove 6 is shorter than the wavelength of the incident infrared in order to prevent the loss of absorption of the incident infrared light. As a concrete example, in an infrared detector for detecting 8 to 14 microns wavelength infrared rays, when the layer thickness t of the compound semiconductor substrate 2 comprising $Cd_xHg_{1-x}Te$ is about 20 microns, the width q of the groove 6 is about 4 microns, the depth of grooves 6 is about 14 microns, the pitch p of the groove 6 about 20 microns, then the element resistance r is doubled in a structure including grooves.

In the above described embodiment, because the diffusion length of extra carriers is larger than the layer thickness t, i.e., about 50 microns, the excess carriers generated by the absorption of the infrared at a region of layer thickness d, where the bias current is not likely to flow, are also dispersed approximately uniformly in the compound semiconductor layer 2 and reach the paths of the bias current, thereby contributing to the output signal. Thus, the loss of absorption of incident infrared light can be suppressed. Accordingly, when the element resistance r is doubled as described above, the incident infrared light is perfectly absorbed and the absorption is not reduced, nearly doubling the sensitivity.

As is evident from the foregoing description, according to the present invention, a plurality of grooves shallower than the layer thickness of the compound semiconductor are disposed in the compound semiconductor perpendicular to the path of the bias current in the light receiving surface of the compound semiconductor. Accordingly, the element resistance can be increased without reducing the absorption of incident infrared light and element sensitivity is increased.

What is claimed is:

1. An infrared detector comprising:

a high resistance substrate;

a compound semiconductor disposed on said substrate and having a surface opposite the substrate;

a pair of spaced apart electrodes disposed on said surface; and a plurality of grooves disposed in said compound semiconductor extending from said surface toward said substrate perpendicular to a current path between said electrodes, said grooves not reaching said substrate.

2. An infrared detector as defined in claim 1 wherein said compound semiconductor has an energy band gap narrower than the energy of absorbed incident infrared ray.

3. An infrared detector as defined in claim 1 wherein said compound semiconductor comprises $Cd_xHg_{1-x}Te$.

4. An infrared detector as defined in claim 1 wherein the pitch of said plurality of grooves is less than the thickness of said compound semiconductor.

5. An infrared detector as defined in claim 1 wherein the thickness of said compound semiconductor is 20 microns, the width of said grooves is 4 microns, the depth of said grooves is 14 microns, and the pitch of said grooves is 20 microns.

6. An infrared detector as defined in claim 1 wherein said grooves are produced by ion milling.

* * * * *